(12) United States Patent
Ishida et al.

(10) Patent No.: US 7,281,832 B2
(45) Date of Patent: *Oct. 16, 2007

(54) VEHICULAR LAMP

(75) Inventors: Hiroyuki Ishida, Shizuoka-ken (JP); Kiyoshi Sazuka, Shizuoka-ken (JP)

(73) Assignee: Koito Manufacturing Co., Ltd., Tokyo (JP)

(*) Notice: Subject to any disclaimer, the term of this patent is extended or adjusted under 35 U.S.C. 154(b) by 84 days.

This patent is subject to a terminal disclaimer.

(21) Appl. No.: 10/850,369

(22) Filed: May 21, 2004

(65) Prior Publication Data

US 2004/0233678 A1   Nov. 25, 2004

(30) Foreign Application Priority Data

May 22, 2003   (JP)   ............................. 2003-145278

(51) Int. Cl.
*F21V 29/00*   (2006.01)
(52) U.S. Cl. ...................... 362/544; 362/543; 362/545; 362/549; 362/507
(58) Field of Classification Search ................ 362/544, 362/543, 545, 549, 507, 800
See application file for complete search history.

(56) References Cited

U.S. PATENT DOCUMENTS 5,032,960 A * 7/1991 Katoh ........................ 362/240
5,601,354 A * 2/1997 Horii et al. .................. 362/551
5,848,839 A * 12/1998 Savage, Jr. .................. 362/267
6,742,920 B2 * 6/2004 Takada et al. ............... 362/539

FOREIGN PATENT DOCUMENTS

| EP | 1 418 381 A2 | 5/2004 |
| EP | 1 418 621 A2 | 5/2004 |
| EP | 1 418 629 A2 | 5/2004 |
| EP | 1 447 617 A | 8/2004 |
| JP | 6-89601 A | 3/1994 |
| JP | 2003 031007 A | 1/2003 |
| JP | 2003-31011 A | 1/2003 |
| JP | 2003-123517 A | 4/2003 |

\* cited by examiner

*Primary Examiner*—Sandra O'Shea
*Assistant Examiner*—Mark Tsidulko
(74) *Attorney, Agent, or Firm*—Sughrue Mion Pllc.

(57) ABSTRACT

A vehicular lamp used in a vehicle includes a semiconductor light emitting element for producing light, a sealing member formed of a material, through which the light passes, for sealing the semiconductor light emitting element, a fixing member for fixing the semiconductor light emitting element by fitting an apparent position of one side of the semiconductor light emitting element when viewed through the sealing member into a reference position to which the semiconductor light emitting element is to be attached, and an optical member for forming at least a part of a cut line, which determines a boundary between bright and dark of a light distribution pattern of the vehicular lamp, by projecting a shape of the one side of the semiconductor light emitting element out of the vehicular lamp.

11 Claims, 11 Drawing Sheets

VEHICULAR LAMP

This patent application claims priority from a Japanese patent application No. 2003-145278 filed on May 22, 2003, the contents of which are incorporated herein by reference.

BACKGROUND OF THE INVENTION

1. Field of the Invention

The present invention relates to a vehicular lamp. More particularly, the present invention relates to a vehicular lamp used in a vehicle.

2. Description of the Related Art

In a vehicular lamp such as a vehicle headlamp, it is necessary to form a light distribution pattern with high precision in view of safety. The light distribution pattern is formed by an optical system using a reflector and a lens as disclosed, for example, in Japanese Patent Application Publication (Laid-Open) No. 1994-89601. In addition, it has been recently studied that a semiconductor light emitting element is used in the vehicle headlamp.

In optical design to form the light distribution pattern, it might be necessary to consider the shape of an emitting area of the light source. And the semiconductor light emitting element produces light from the emitting area with expansion such as the entire surface thereof. Therefore, if the semiconductor light emitting element is used in the vehicle headlamp, the optical design is complicated, and it is difficult to form a proper light distribution pattern.

SUMMARY OF THE INVENTION

Therefore, it is an object of the present invention to provide a vehicular lamp, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular lamp used in a vehicle includes a semiconductor light emitting element for producing light, a sealing member formed of a material through which the light passes for sealing the semiconductor light emitting element, a fixing member for fixing the semiconductor light emitting element by fitting an apparent position of one side of the semiconductor light emitting element when viewed through the sealing member into a reference position to which the semiconductor light emitting element is to be attached, and an optical member for forming at least a part of a cut line, which determines a boundary between bright and dark of a light distribution pattern of the vehicular lamp, by projecting a shape of the one side of the semiconductor light emitting element out of the vehicular lamp.

The fixing member may fix the semiconductor light emitting element by fitting the apparent position of the one side into the reference position predetermined within a horizontal plane which includes a light axis of the vehicular lamp.

The sealing member may be shaped like a convex lens, and the fixing member may fix the semiconductor light emitting element by fitting one side of an image of the semiconductor light emitting element magnified by the convex lens-shaped sealing member into the reference position so as to fit the apparent position of the one side of the semiconductor light emitting element into the reference position.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 10 shows an example of a light distribution pattern 300a.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
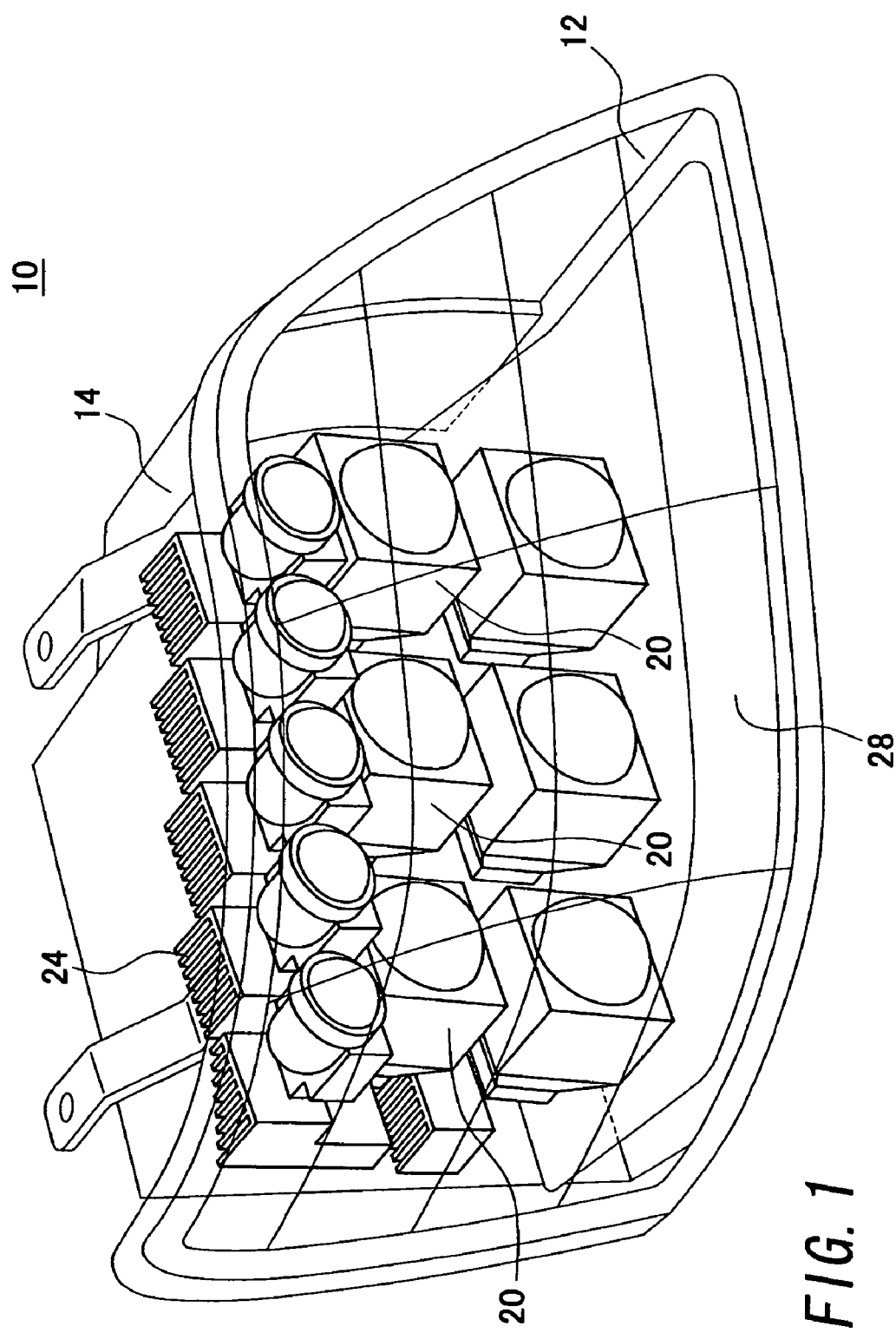
FIG. 1 shows a perspective view of a vehicular lamp 10.
Figure 2:
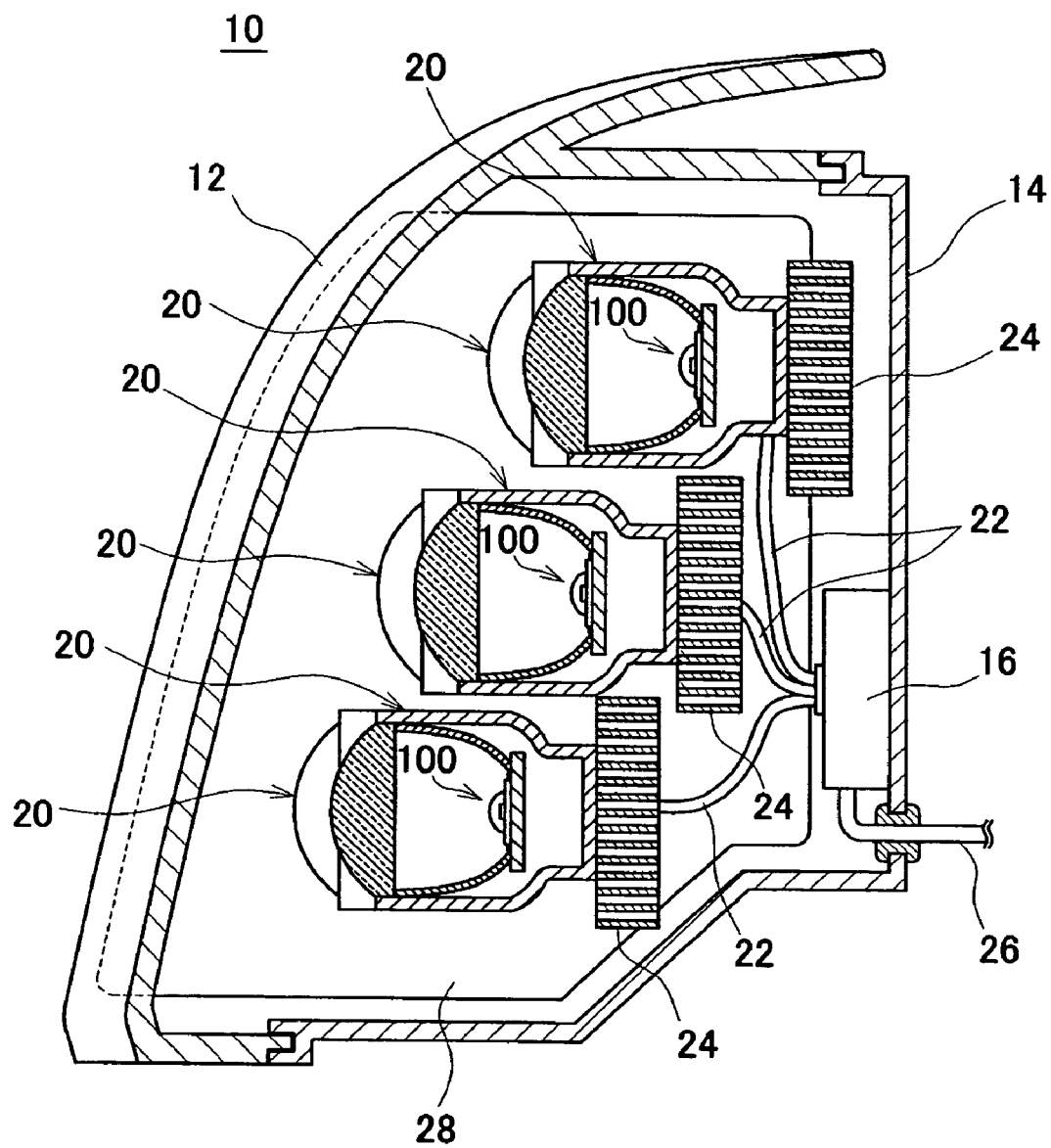
FIG. 2 shows a horizontally sectional view of the vehicular lamp 10.

FIGS. 1 and 2 show an example of the configuration of a vehicular lamp 10 according to an exemplary embodiment of the present invention. FIG. 1 shows a perspective view of the vehicular lamp 10. FIG. 2 shows a horizontally sectional view of the vehicular lamp 10 by a horizontal plane crossing the middle of a light source unit 20. In this embodiment, it is an object of this embodiment to form a light distribution pattern of the vehicular lamp 10 with high precision. The vehicular lamp 10 is a vehicle headlamp which is used in a vehicle such as an automobile, emitting light in a forward direction of the vehicle. The vehicular lamp 10 includes a plurality of light source units 20, a cover 12, a lamp body 14, a circuit unit 16, a plurality of heat radiating members 24, an extension reflector 28, and cables 22 and 26.

Each of the light source units 20 includes a LED module 100 so as to emit the light of a predetermined distribution pattern based on the light produced by the LED module 100. The light source units 20 are supported by the lamp body 14 to move obliquely by way of an aiming mechanism for adjustment of the direction of the light axis of the light source units 20. The light source units 20 may be supported by the lamp body 14 in order that the light axis faces downwards by 0.3 to 0.6 degrees when the vehicular lamp 10 is attached to the vehicle body.

Further, the plurality of light source units 20 may have the same or similar light distribution characteristics or different light distribution characteristics from each other. And in another embodiment, one of the light source units 20 may have a plurality of LED module 100. The light source units 20 may have semiconductor lasers in place of the LED modules 100.

The cover 12 and the lamp body 14 forms a lamp chamber of the vehicular lamp 10, in which the light source units 20 are contained. The cover 12 and the lamp body 14 may seal or waterproof the light source units 20. The cover 12 is translucent, made of a material through which the light produced by the LED module 100 passes, provided on a front surface of the vehicle, covering a front of the light source units 20. The lamp body 14 faces the cover 12 with the light source units 20 interposed therebetween, covering a rear of the light source units 20.

The circuit unit 16 is a module in which a lighting circuit for lighting the LED module 100 is formed. The circuit unit 16 is electrically coupled to the light source units 20 via the cables 22. And the circuit unit 16 is electrically coupled to the outside of the vehicular lamp 10 via the cables 26.

The heat radiating members 24 are heat sinks which are provided contacting at least a part of the light source units 20. The heat radiating member 24 is made of a material whose coefficient of thermal conductivity is higher than air such as metal. The heat radiating members 24 are pivotally movable on the aiming mechanism, accompanying the light source units 20 within a range of the movement of the light source units 20, also having a sufficient space against the lamp body 14 to adjust the light axis of the light source units 20. The heat radiating members 24 may be integrally formed as a metal member. In this case, the entire heat radiating members 24 can dissipate heat efficiently.

The extension reflector 28 is made of a thin metal plate, reaching the cover 12 from the bottoms of the light source units 20. The extension reflector 28 covers at least a part of an inner surface of the lamp body 14 so as to conceal the inner surface of the lamp body 14, thereby improving the appearance of the vehicular lamp 10.

At least a part of the extension reflector 28 touches the light source units 20 and/or the heat radiating members 24. In this case, the extension reflector 28 functions as a heat conducting member for conducting the heat produced by the LED module 100 to the cover 12. Accordingly, the extension reflector 28 dissipates the heat of the LED module 100. And a part of the extension reflector 28 is fixed to the cover 12 or the lamp body 14. The extension reflector 28 may be shaped to cover the top, bottom, and sides of the light source units 20.

According to this embodiment, using the LED module 100 as the light source, the light source units 20 can be small. In addition, thanks to this, the degree of freedom for arrangement of the light source units 20 is improved, so it is possible to provide the vehicular lamp 10 of good characteristics for design.

Figure 3:
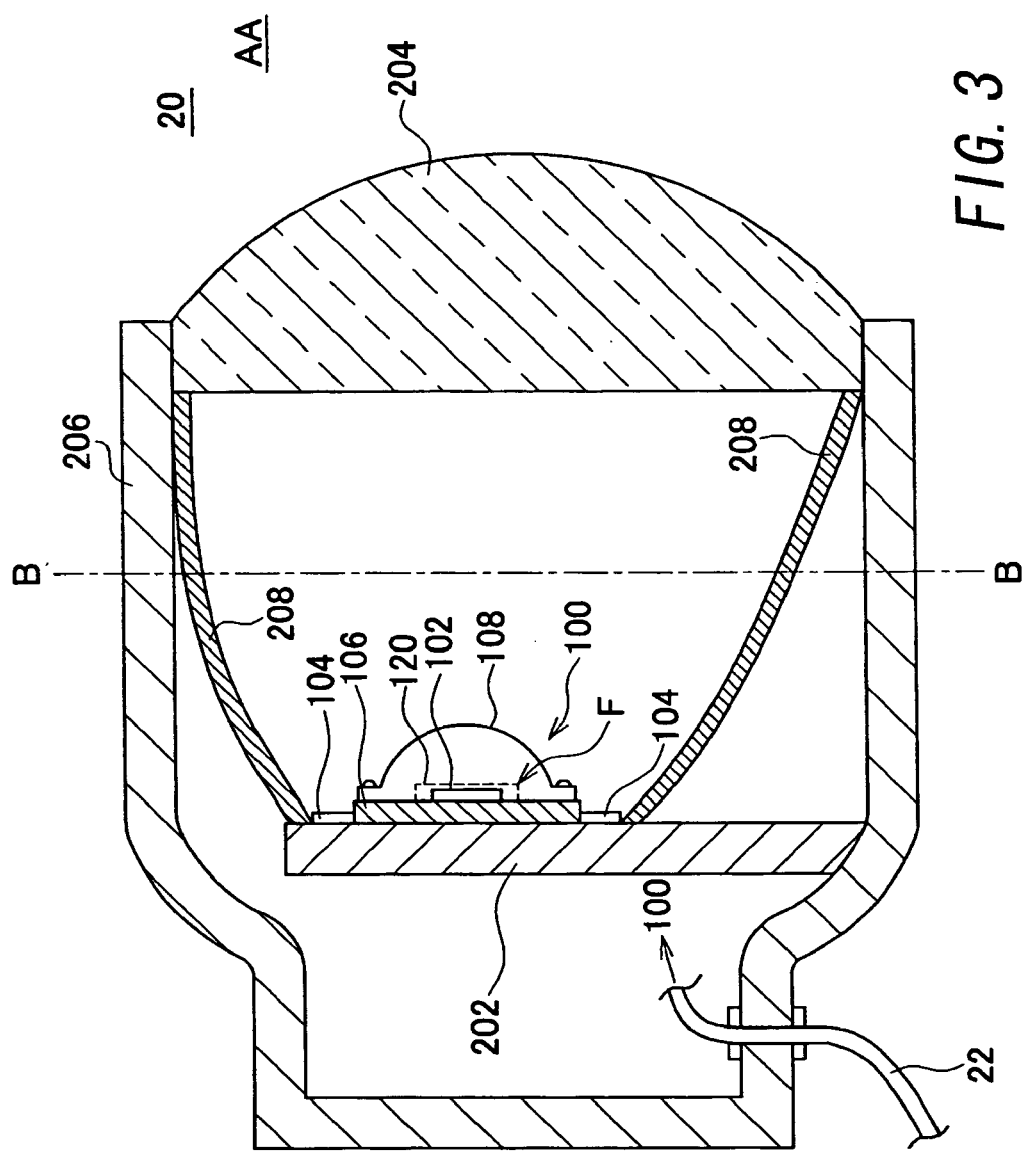
FIG. 3 shows a vertically sectional view AA of a light source unit 20.
Figure 4:
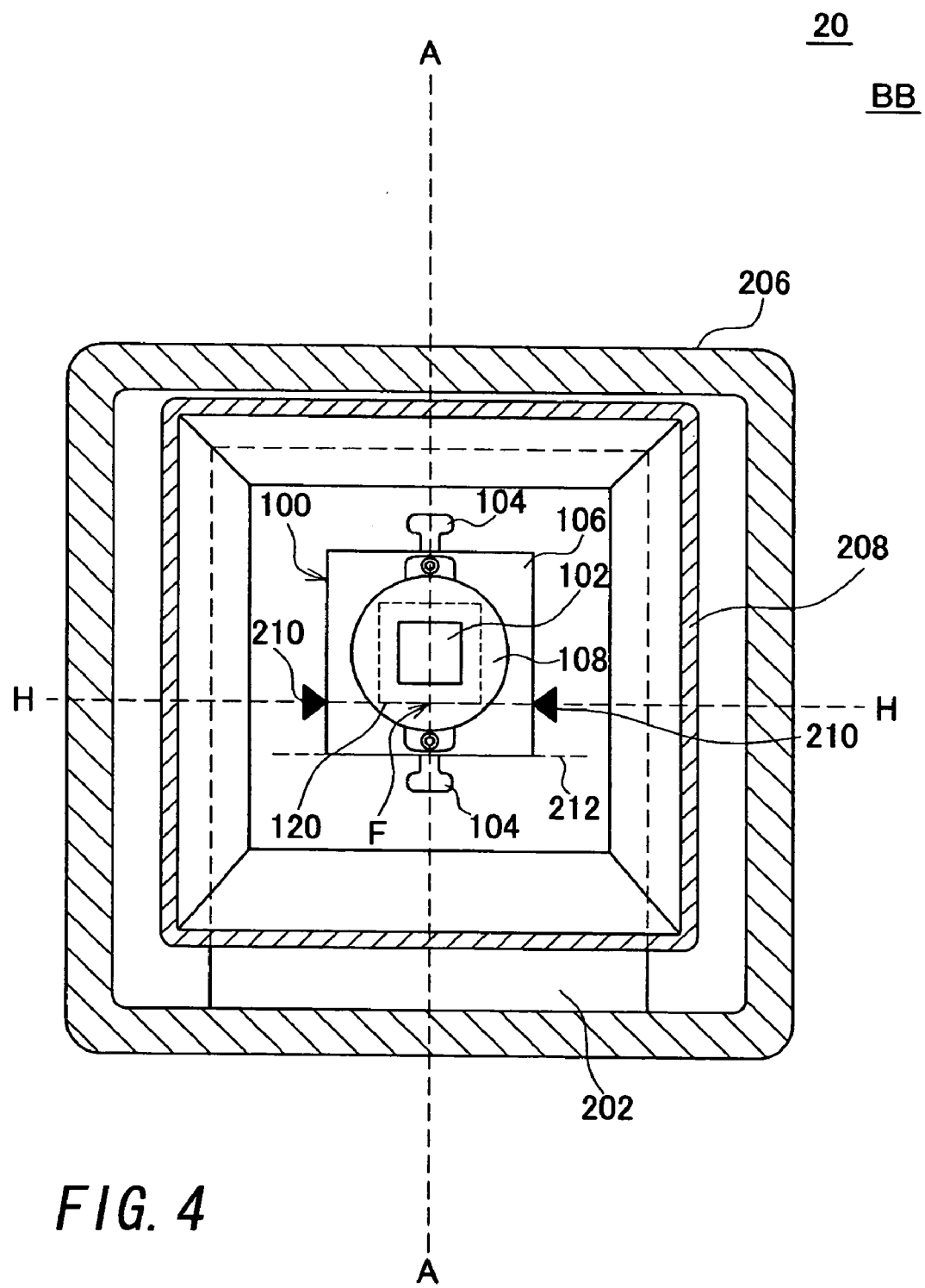
FIG. 4 shows a vertically sectional view BB of the light source unit 20.

FIGS. 3 and 4 show an example of the configuration of the light source unit 20. FIG. 3 shows a vertically sectional view AA of a light source unit 20. FIG. 4 shows a vertically sectional view BB of the light source unit 20. The light source unit 20 is a straight emission type light source unit for emitting the light generated by the LED module 100 in the forward direction through the lens 204, including a LED module 100, a lens 204, a fixing member 202, an extension 208, and a housing 206.

The LED module 100 is a light source for emitting white light, producing the light based on the power received from the outside of the light source unit 20 via the cable 22. The lens 204 is an example of an optical member used in the vehicular lamp 10 (see FIG. 1), emitting the light generated by the LED module 100 in the forward direction of the vehicle, thereby forming at least a part of the light distribution pattern of the vehicular lamp 10.

The fixing member 202 is shaped like a plate whose surface faces in the forward direction of the vehicle, on which a bottom surface of the LED module 100 is supportably fixed. Accordingly, the fixing member 202 makes the LED module 100 emit light in the forward direction of the vehicle. And the fixing member 202 is made of a material whose coefficient of thermal conductivity is higher than air such as metal, functioning as a radiating plate for dissipating the heat produced by the LED module 100. In this embodiment, the fixing member 202 is touching the housing 206 at its one end, so that it conducts the heat produced by the LED module 100 to the housing 206, thereby dissipating the heat of the LED module 100. Accordingly, it is possible to prevent the amount of the light emitted by the LED module 100 from being reduced by the heat.

The extension 208 is made of a thin metal plate, extending from the vicinity of the LED module 100 to the vicinity of an edge section of the lens 204. Accordingly, the extension 208 conceals the gap between an inner surface of the housing 206 and the LED module 100 so as to improve the appearance of the vehicular lamp 10. The extension 208 may reflect the light produced by the LED module 100.

The housing 206 is shaped like a box for containing the LED module 100, the fixing member 202, and the extension 208. And the housing 206 has an opening in its front face, in which the lens 204 is held. The housing 206 may conduct the heat received from the LED module 100 via the fixing member 202 to the heat radiating members 24 (see FIG. 1) and/or the extension reflector 28 (see FIG. 1). Accordingly, it is possible to properly dissipate the heat of the LED module 100.

Hereafter, the LED module 100 and the fixing member 202 will be described in further detail. The LED module 100 includes a plurality of electrodes 104, a base plate 106, a semiconductor light emitting element 102, and a sealing member 108. The electrodes 104 are electrically coupled to the semiconductor light emitting element 102, supplying the power supplied from the outside of the light source units 20 via the cables 22 to the semiconductor light emitting element 102.

The base plate 106 is a plate-shaped body which is fixed to a surface of the fixing member 202, holding the semiconductor light emitting element 102 towards the lens 204. And, at least a part of the base plate 106 is made of a material whose coefficient of thermal conductivity is higher than air such as metal, conducting the heat produced by the semiconductor light emitting element 102 to the fixing member 202.

The semiconductor light emitting element 102 is a light emitting diode element for emitting light from a surface which faces in a direction from the base plate 106 towards the sealing member 108, facing the fixing member 202 with the base plate 106 therebetween, producing light in response to the power received from the outside of the light source units 20. The semiconductor light emitting element 102 emits blue light towards a fluorescent material provided on its surface, thereby allowing the fluorescent material to emit yellow light which is complementary to the blue light. In this case, the LED module 100 produces white light based on the blue and yellow light produced by the semiconductor light emitting element 102 and the fluorescent material respectively. In another embodiment, the semiconductor light emitting element 102 may emit infrared light to the fluorescent material so as to allow the fluorescent material to emit the white light.

Further, the surface of the semiconductor light emitting element 102 is an approximate rectangle of 1 mm². The semiconductor light emitting element 102 produces light from its entire surface. The semiconductor light emitting element 102 is an example of a flat light source for producing light from a flat area with expansion.

The sealing member 108 is a mold for sealing the semiconductor light emitting element 102. The sealing member 108 is made of a material through which the white light produced by the semiconductor light emitting element 102 passes such as translucent resin. The sealing member 108 may be made of a material whose index of refraction is larger than air, covering the light emitting surface of the semiconductor light emitting element 102. Accordingly, it is possible to efficiently take out and use the light produced by the inside of the semiconductor light emitting element 102.

And, at least a part of the surface of the sealing member 108 is shaped like an approximate sphere whose center lies on the semiconductor light emitting element 102. Accordingly, the sealing member 108 is shaped like a convex lens. In this embodiment, the sealing member 108 is a hemisphere for sealing the semiconductor light emitting element 102 in its center.

In this case, by controlling the directivity of the light produced by the semiconductor light emitting element 102, the light can properly enter the lens 204. And if the semiconductor light emitting element 102 is viewed from the lens 204 through the sealing member 108, the semiconductor light emitting element 102 magnified by the convex lens formed by the sealing member 108 has its image 120 whose size and shape is shown as a dashed line in appearance. The size of the image 120 results from multiplying the size of the semiconductor light emitting element 102 by the index of refraction. Accordingly, the size of the image 120 is approximately 1.4 or 1.6 times as large as the size of the semiconductor light emitting element 102. Further, a part of the sealing member 108 may be shaped like a convex lens.

The fixing member 202 includes a plurality of markers 210 provided in response to a reference position to which the semiconductor light emitting element 102 is to be attached, fixing the LED module 100 based on the positions of the markers 210. In this embodiment, the markers 210 indicate the reference position into which one side of the image 120 of the semiconductor light emitting element 102 magnified by the convex lens-shaped sealing member 108 is to fit. The fixing member 202 fixes the semiconductor light emitting element 102 on a predetermined position by fastening the LED module 100.

In this case, by fitting the one side of the image 120 into the reference position, an apparent position of one side of the semiconductor light emitting element 102 when viewed through the sealing member 108 fits into the reference position, whereby the fixing member 202 fixes the semiconductor light emitting element 102. Here, the apparent position of the one side of the semiconductor light emitting element 102 viewed through the sealing member 108 fits into the reference position is a position which is optically equivalent to the one side of semiconductor light emitting element 102 when viewed through the sealing member 108.

And in this embodiment, the reference position into which the one side of the image 120 is to fit is predetermined within a horizontal plane which includes the light axis of the light source units 20. The reference position is determined on a line which extends in a lateral direction of the vehicle, crossing a focus F of the lens 204. In this case, the fixing member 202 matches the center of the one side of the image 120 such as a lower side with the focus F so as to fix the LED module 100.

And in this case, the one side of the semiconductor light emitting element 102 such as a lower side is fixed at a position shifted upwards from the reference position by a distance in response to the magnification ratio of the image 120 to the semiconductor light emitting element 102. The one side of the semiconductor light emitting element 102 may be fixed at a position shifted upwards by half of the difference in size between the image 120 and the semiconductor light emitting element 102 from the reference position into which the one side of the image 120 is to fit.

For example, if each side of the image 120 is approximately 1.4 to 1.6 times as large as each side of the semiconductor light emitting element 102, the lower side of the semiconductor light emitting element 102 is fixed upwards by the distance which is approximately 0.2 to 0.3 times as large as the length of the side of the semiconductor light emitting element 102 extending vertically. The one side of the semiconductor light emitting element 102 may be fixed upwards by the distance in response to the magnification ratio of the image 120 to the semiconductor light emitting element 102 with respect to the light axis of the light source units 20.

Here in this embodiment, the lens 204 projects the shape of the one side of the semiconductor light emitting element 102 to the outside of the vehicular lamp 10, thereby forming at least a part of a cut line which determines a the boundary between bright and dark of the light distribution pattern of the vehicular lamp 10. Accordingly, if the one side of the semiconductor light emitting element 102 is fixed, fitting into the focus F., the lens 204 projects the image 120 magnified by the sealing member 108, whereby the shape of the one side of the semiconductor light emitting element 102 might not be projected with high precision. However, in this embodiment, inconsideration of the effect of the image 120, the semiconductor light emitting element 102 can be fixed to the lens 204 with high precision. Accordingly, the lens 204 can project the shape of the one side of the semiconductor light emitting element 102 in response to the one side of the image 120 in the forward direction of the vehicle with high precision. And accordingly, the light distribution pattern of the vehicular lamp 10 can be formed with high precision.

Further, the focus F is an example of the optical center of the optical member used for the light source unit 20. The optical center may be a reference point in optical member design. And the horizontal plane including the light axis may be a horizontal plane including the light axis if the light axis of the light source units 20 faces in the horizontal direction. If the direction of the light axis of the light source units 20 is adjusted by the aiming mechanism, the reference position into which the one side of the image 120 is to fit may be predetermined in order that its horizontal plane is within a sloping plane in response to the angle by which the light source unit 20 slopes in adjustment. The reference position may be predetermined within a horizontal plane which includes the light axis of the vehicular lamp 10.

And the fixing member 202 may further have a reference line 212 which is shown as a dashed line in FIG. 4. The reference line 212 may indicate the position into which the one side of the base plate 106 such as a lower side of the base plate 106 is to fit. The reference line 212 preferably indicates the position into which the one side of the base plate 106 is to fit, parallel to the one side of the image 120 fitting into the reference position. The reference line 212 may be provided at a position predetermined on the basis of the distance between the one side of the image 120 and the one side of the base plate 106. In this case, the semiconductor light emitting element 102 can be also fixed with high precision. And the fixing member 202 may have a level difference for engagement with the one side of the base plate 106 on the position in response to the reference line 212.

Figure 5:
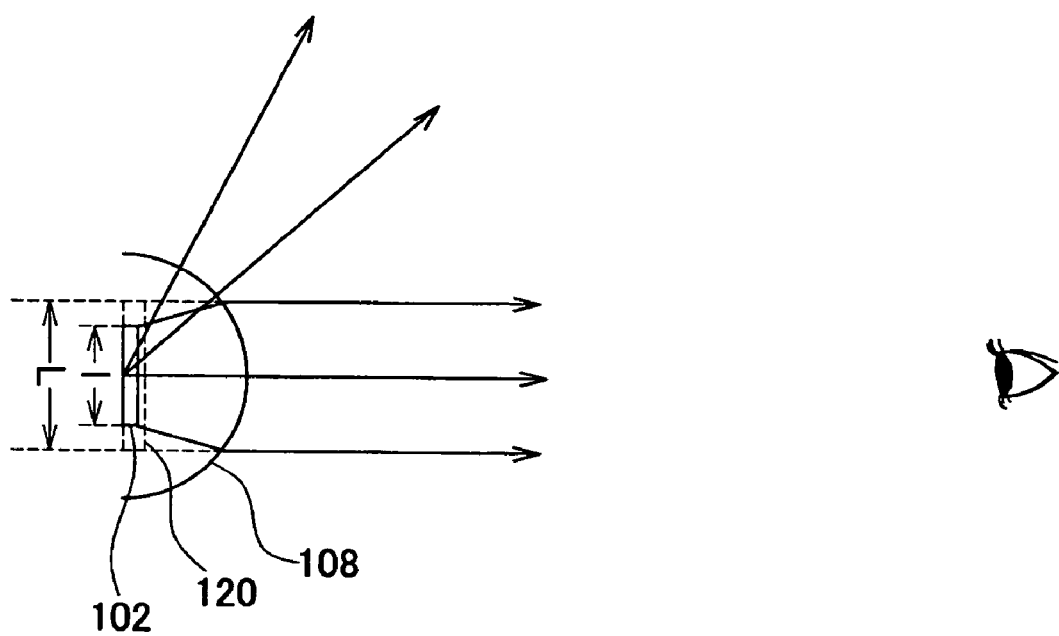
FIG. 5 shows an example of an image 120.

FIG. 5 shows an example of the image 120. The image 120 is a virtual image of the semiconductor light emitting element 102 formed by the convex lens-shaped sealing member 108, visible to an observer as the light from the surface of the semiconductor light emitting element 102 reaches the observer through the sealing member 108.

Here in this embodiment, the sealing member 108 is shaped like a hemisphere or convex lens whose center matches the center of the semiconductor light emitting element 102. In this case, the sealing member 108 allows the light from the center of the semiconductor light emitting element 102 towards the observer to pass through it straight. Meanwhile, the sealing member 108 deflects the light from a section except the center of the semiconductor light emitting element 102 towards the observer to the light axis of the convex lens. For example, the sealing member 108 deflects a part of the light from an edge section of the semiconductor light emitting element 102 towards the observer in a direction perpendicular to the surface of the semiconductor light emitting element 102. And the observer perceives the image 120 magnified by the sealing member 108 in response to the light deflected. Accordingly, the semiconductor light emitting element 102 has the size and shape of the image 120 in appearance when viewed through the sealing member 108.

Further in this embodiment, the width of the semiconductor light emitting element 102 when viewed from its side is 1. The top view of the semiconductor light emitting element 102 may be an approximate rectangular whose one side is 1. In this case, the observer perceives the image 120 whose width L is 1.4 to 1.6 times as large as 1 in place of the semiconductor light emitting element 102 whose width is 1.

And if a part of the sealing member 108 is shaped like a convex lens, the sealing member 108 forms an image of the semiconductor light emitting element 102 whose size and shape responds to the light deflected by the convex lens-shaped section. In this case, the semiconductor light emitting element 102 has the size and shape of the image in appearance.

Figure 6:
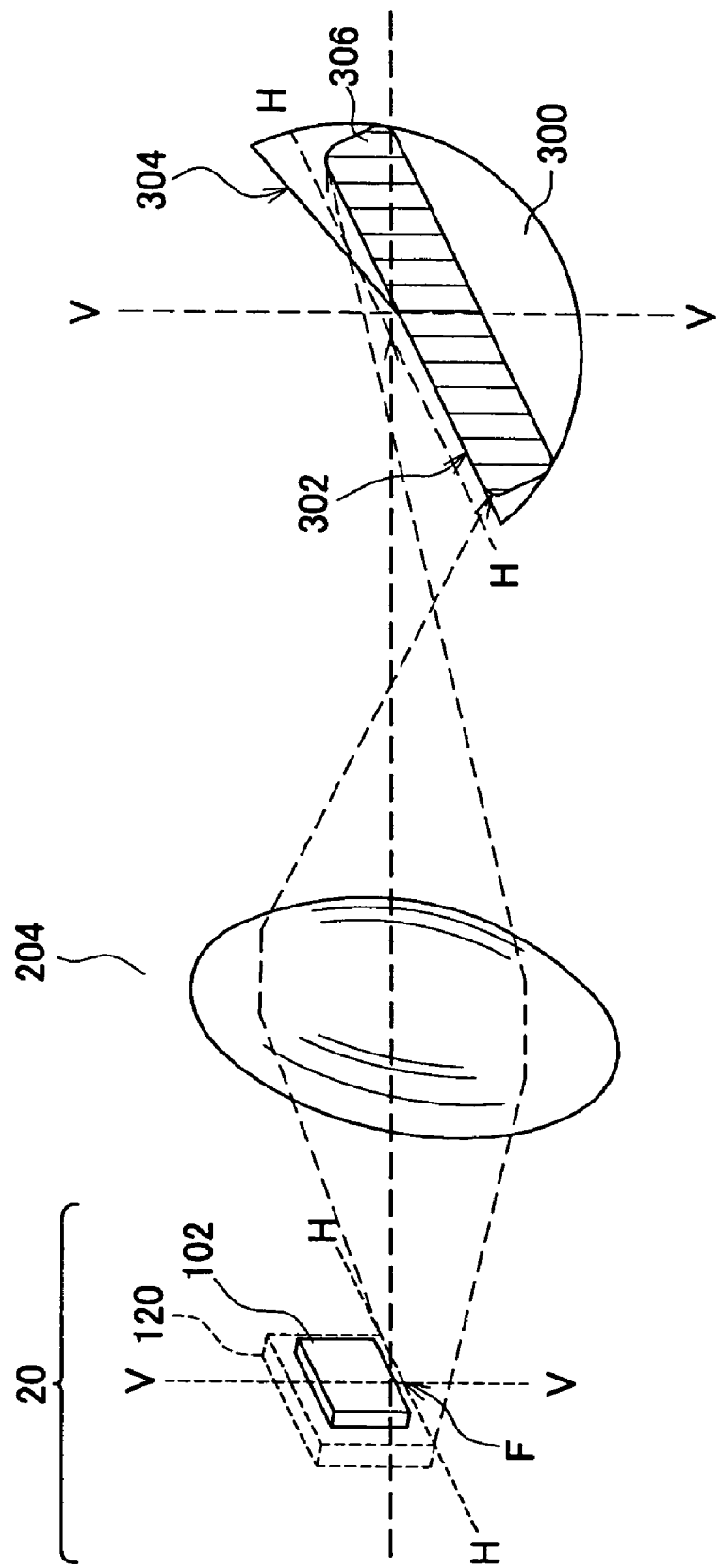
FIG. 6 shows an example of a light distribution pattern 300.

FIG. 6 shows an example of a light distribution pattern 300 formed by the vehicular lamp 10 (see FIG. 1). The light distribution pattern 300 is a low beam light distribution pattern which is formed on a vertically virtual screen disposed 25 m away from the front of the vehicular lamp 10. In this embodiment, the vehicular lamp 10 forms the light distribution pattern 300 having a the horizontal cut line 302 which determines the boundary between bright and dark in an approximately horizontal direction and an oblique cut line 304 which determines the boundary between bright and dark in an oblique direction by 15 degree against the horizontal direction.

In this embodiment, the vehicular lamp 10 includes the plurality of light source units 20 whose light distribution characteristics are different from each other, forming the light distribution pattern 300 based on the light produced by each of the light source units 20. In this case, each of the light source units 20 forms a partial area of the light distribution pattern 300. For example, the light source unit 20 described in connection with FIGS. 3 and 4 forms a partial area 306 of the light distribution pattern 300.

Hereafter, the light distribution characteristics of the light source units 20 described in connection with FIGS. 3 and 4 will be described in detail. In this embodiment, the lens 204 of the light source units 20 emits the light produced by the semiconductor light emitting element 102 forward, projecting the shape of the semiconductor light emitting element 102 in the forward direction of the vehicle so as to form an area 306. The lens 204 may magnify and project the shape of the semiconductor light emitting element 102 in the horizontal direction.

Here in this embodiment, the lens 204 has its focus F on a lower side of the image 120 of the semiconductor light emitting element 102 which extends in the horizontal direction, viewed through the sealing member 108 (see FIG. 3). And the lens 204 emits the light produced by the semiconductor light emitting element 102 in order that the light axes of the light source units 20 cross each other. Accordingly, the lens 204 projects the lower side of the image 120 which responds to the lower side of the semiconductor light emitting element 102 as an upper side of the area 306.

The lens 204 forms at least a part of the upper side of the area 306 at the position where at least a part of the horizontal cut line 302 is to be formed. Accordingly, the light source units 20 form at least a part of the horizontal cut line 302 based on the boundary between bright and dark formed by the area 306. Here, the lens 204 has its focus F on the one side of the image 120 which is optically equivalent to the one side of the semiconductor light emitting element 102. Therefore, according to this embodiment, it is possible to form the clear horizontal cut line 302 based on the shape of the one side of the semiconductor light emitting element 102.

Further in another embodiment, the light source units 20 may at least a part of the oblique cut line based on the light produced by the semiconductor light emitting element 102 whose lower side is fixed parallel to an oblique direction. According to this embodiment, it is possible to form the clear horizontal cut line 302.

Figure 7:
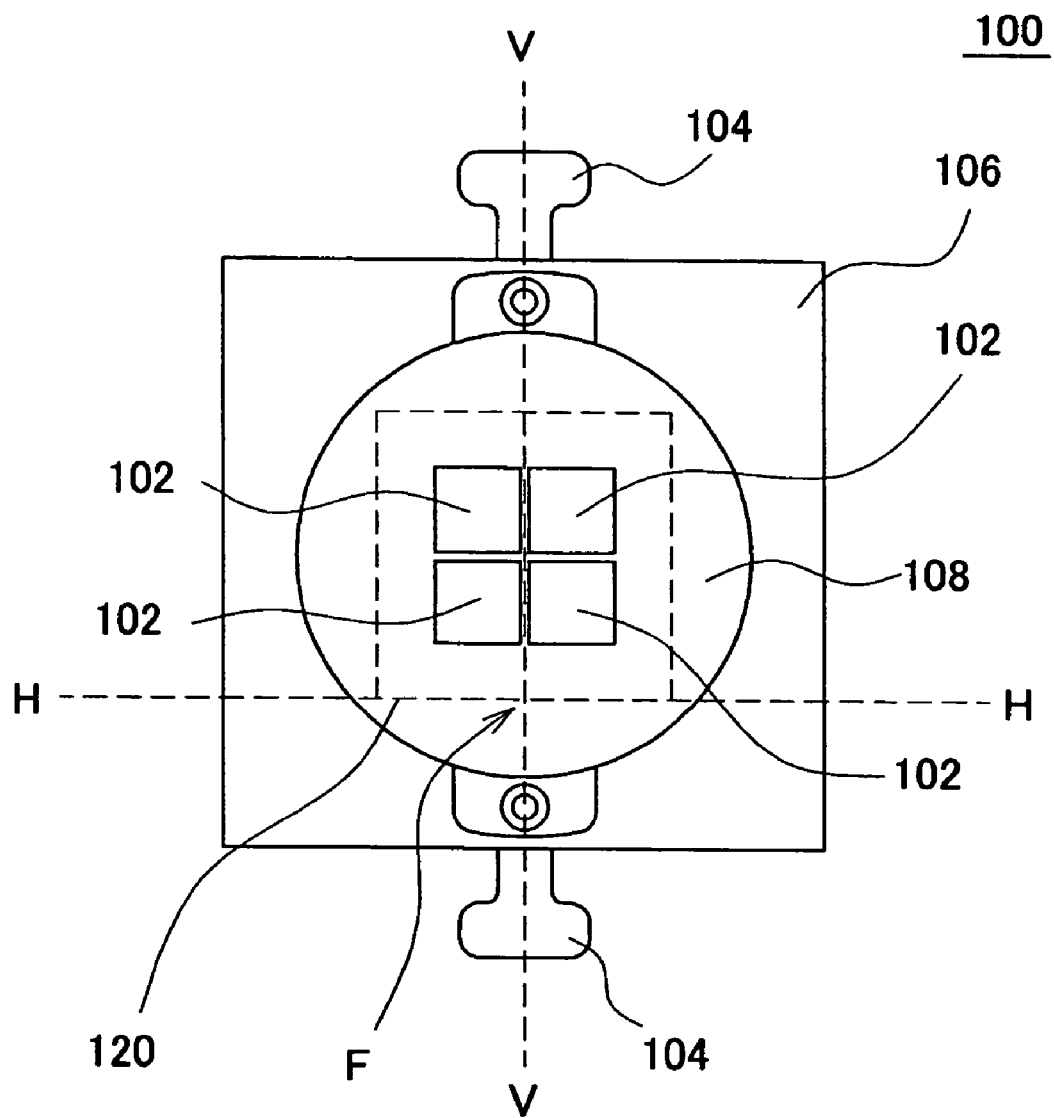
FIG. 7 shows another example of the configuration of a LED module 100.

FIG. 7 shows another example of the configuration of the LED module 100. In this embodiment, the LED module 100 includes a plurality of semiconductor light emitting elements 102. And the image 120 is an image which responds to the plurality of semiconductor light emitting elements 102. The image 120 envelops the outline of the image of each of the semiconductor light emitting elements 102. In this case, since the one side of the image 120 fits into the reference position, the light distribution pattern can be properly formed. Further, the fixing member 202 (see FIGS. 3 and 4) may fit the one side of the image of one of the semiconductor light emitting elements 102 into the reference position so as to fit the apparent position of the one side of the semiconductor light emitting element 102 into the reference position, thereby fixing the semiconductor light emitting elements 102.

Figure 8:
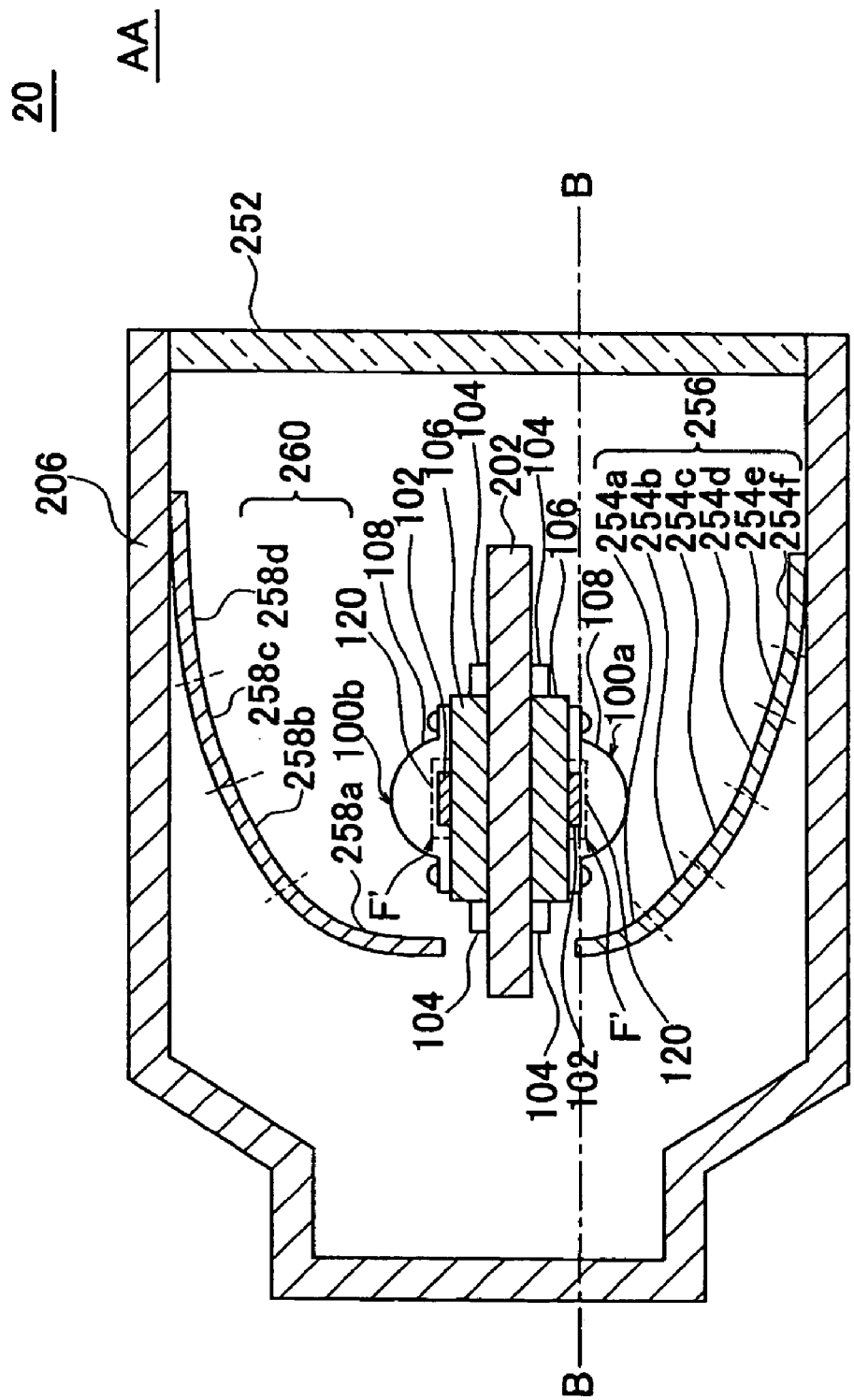
FIG. 8 shows a horizontally sectional view AA of a light source unit 20.
Figure 9:
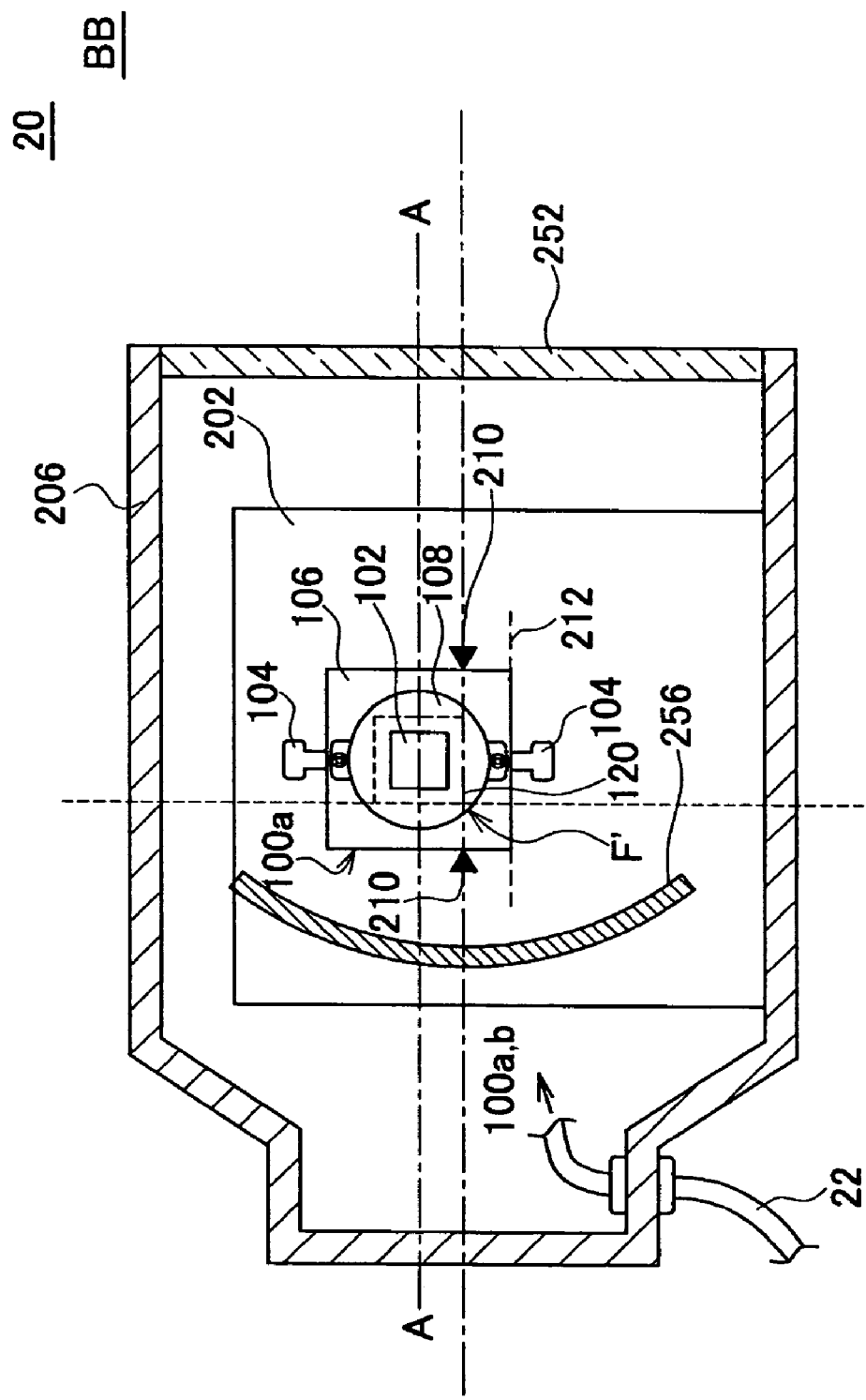
FIG. 9 shows a vertically sectional view BB of the light source unit 20.

FIGS. 8 and 9 show another example of the configuration of the light source unit 20. FIG. 8 shows a horizontally sectional view AA of the light source unit 20. FIG. 9 shows a vertically sectional view BB of the light source unit 20. Further, matters in FIGS. 8 and 9 given the same symbols as those in FIGS. 3 and 4 except the points to be described later will not be described because they have the same or similar functions as those in FIGS. 3 and 4.

In this embodiment, the light source units 20 includes a cover 252, a plurality of LED modules 100*a* and 100*b*, a fixing member 202, and a plurality of reflectors 256 and 260. The cover 252 is made of a material through which the light produced by the semiconductor light emitting element 102 can pass, translucently formed on the front surfaces of the light source units 20.

The LED modules 100a and 100b are fixed to the fixing member 202, where their bottom surfaces face each other with the fixing member 202 interposed therebetween. Front and rear surfaces of the fixing member 202 face in the lateral direction of the vehicle. And the LED modules 100a and 100bare fixed to the front and rear surfaces of the fixing member 202 respectively. In this case, the fixing member 202 fits the one side of the image 120 of each of the LED modules 100a and 100b into the corresponding reference position to fix it.

Here, the reference position corresponding to the LED module 100a takes the optical center F' which is a reference point in designing the reflector 256 as its one end, determined on a line which extends in the horizontal direction. The fixing member 202 matches an apex of the image 120 of the semiconductor light emitting element 102 of the LED module 100a with the optical center F'and fits the one side of the image 120 into the reference position so as to fix the LED module 100a. And the fixing member 202 matches the optical center F' of the reflector 260 with an apex of the image 120 of the LED module 100b so as to fix the LED module 100b.

Each of the reflectors 256 and 260 in response to the LED modules 100a and 100b respectively is formed to cover the corresponding LED module 100 from the back of the vehicle. Accordingly, each of the reflectors 256 and 260 reflects the light produced by the semiconductor light emitting element 102 of the corresponding LED module 100 in the forward direction of the vehicle. Further, the reflectors 256 and 260 are an example of optical members used in the vehicular lamp 10 (see FIG. 1), emitting the light produced by the corresponding semiconductor light emitting elements 102 in the forward direction of the vehicle so as to form at least a part of the light distribution pattern of the vehicular lamp 10 (see FIG. 1).

In this embodiment, the reflector 256 has a plurality of light distribution steps 254a to 254f. The reflector 256 forms at least a part of the oblique cut line of the light distribution pattern of the vehicular lamp 10 based on the light reflected by the light distribution steps 254a to 254f.

Further, each of the light distribution steps 254a to 254f is a part of the reflector 256 which is sectioned in the shaped of a rectangle or obliquely sloping trapezoid, formed of, e.g. a hyperbolic and parabolic surface which is set corresponding to the shape of the oblique cut line supposed to be formed at each position on a parabolic surface. Here, the hyperbolic and parabolic surface is the same as or similar to a curved surface formed of parabolas whose substantially vertical cross-section becomes wider towards the front of the light source unit 20 and whose substantially horizontal cross-section becomes wider towards the back of the light source unit 20.

The reflector 260 includes a plurality of the light distribution steps 258a to 258f. The reflector 260 forms at least a part of the horizontal cut line of the light distribution pattern of the vehicular lamp 10 based on the light reflected by the light distribution steps 258a to 258f. The light distribution steps 258a to 258f may have the same configurations as those of the light distribution steps 254a to 254f. According to this embodiment, the light distribution pattern can be properly formed.

Figure 10:
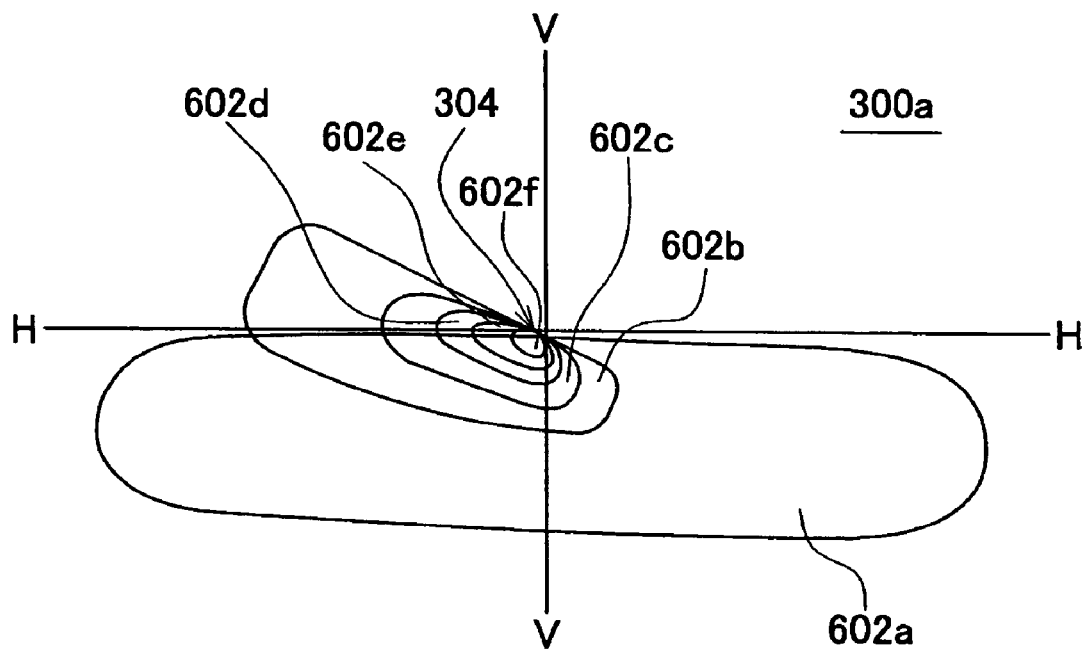
Figure 10:
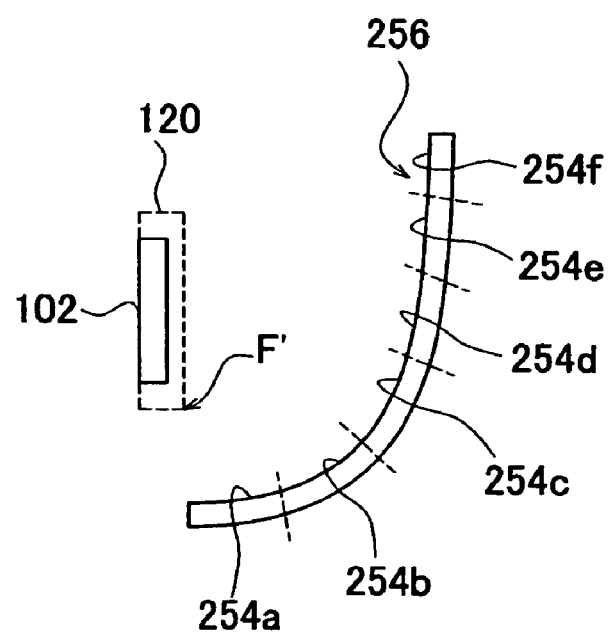

FIG. 10 shows an example of a light distribution pattern 300a formed by the reflector 256. In this embodiment, the reflector 256 forms the light distribution pattern 300a which includes a plurality of areas 602a to 602f. Each of the light distribution steps 254a to 254f reflects the light produced by the semiconductor light emitting element 102 of the LED module 100a so as to form the areas 602a to 602f respectively.

In this case, the light distribution step 254a forms the area 602a which expands in the approximately horizontal direction. And the light distribution steps 254b to 254f form the areas 602b to 602f which expand in a predetermined oblique direction. Accordingly, the reflector 256 forms at least a part of the oblique cut line 304 based on the boundary between bright and dark of the areas 602b to 602f.

Here, the semiconductor light emitting element 102 is fixed in order that at least a part of the one side of the image 120 fits into the optical center F' of the reflector 256. And the light distribution steps 254a to 254f are formed to take the optical center F' as their common reference point in design. Therefore, according to this embodiment, the oblique cut line 304 can be formed with high precision based on the light produced by the LED module 100a. In addition, the light distribution pattern can be properly formed.

Figure 11:
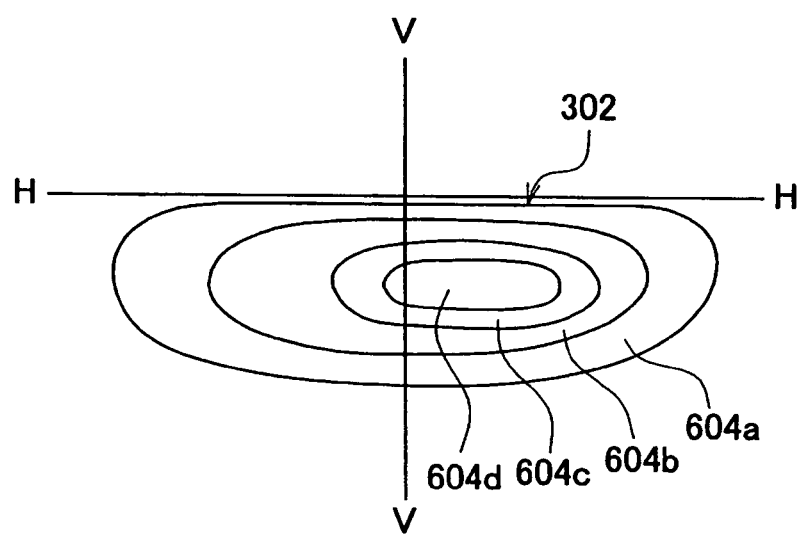
FIG. 11 shows an example of a light distribution pattern 300b.
Figure 11:
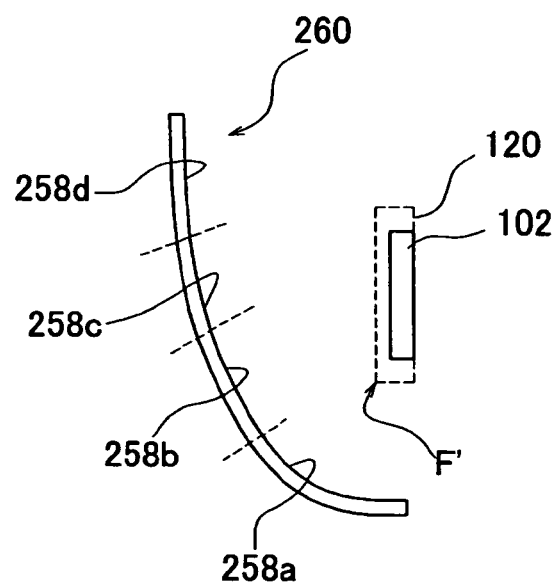

FIG. 11 shows an example of a light distribution pattern 300b formed by the reflector 260. In this embodiment, the reflector 260 forms the light distribution pattern 300b which includes a plurality of areas 604a to 604d. Each of the light distribution steps 258a to 258f reflects the light produced by the semiconductor light emitting element 102 of the LED module 100b so as to form the areas 604a to 604d respectively. The reflector 260 forms at least a part of the horizontal cut line 302 based on the boundary between bright and dark of the areas 604a to 604d.

Here, the semiconductor light emitting element 102 is fixed in order that at least a part of the one side of the image 120 fits into the optical center F' of the reflector 260. And the light distribution steps 258a to 258f are formed to take the optical center F' as their common reference point in design. Therefore, according to this embodiment, the horizontal cut line 302 can be formed with high precision based on the light produced by the LED module 100b. In addition, the light distribution pattern can be properly formed.

As obvious from the description above, according to the present invention, it is possible to properly form the light distribution pattern.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular lamp used in a vehicle, comprising:
a semiconductor light emitting element for producing light;
a sealing member, formed of a material through which said light passes, for sealing said semiconductor light emitting element, said sealing member having a certain refractive index;
a fixing member for fixing said semiconductor light emitting element by aligning an apparent position of one side of said semiconductor light emitting element when viewed through said sealing member on a reference position for positioning said semiconductor light emitting element when attached; and
a lens for forming at least a part of a cut line, which determines a boundary between bright and dark of a light distribution pattern of said vehicular lamp, by projecting a shape of said one side of said semiconductor light emitting element out of said vehicular lamp, wherein said fixing member fixes said semiconductor light emitting element by fitting said apparent position of said one side into said reference position predetermined within a horizontal plane which includes a light axis of said vehicular lamp.

2. A vehicular lamp as claimed in claim 1, wherein:
said sealing member is shaped like a convex lens; and
said fixing member fixes said semiconductor light emitting element by fitting one side of an image of said semiconductor light emitting element magnified by said convex lens-shaped sealing member into said reference position so as to fit said apparent position of said one side of said semiconductor light emitting element into said reference position.

3. A vehicular lamp as claimed in claim 1, wherein said reference position is an optical center of the optical member.

4. A vehicular lamp as claimed in claim 1, wherein the semiconductor light emitting element comprises a light emitting surface that is rectangular.

5. A vehicular lamp as claimed in claim 4, wherein the semiconductor light emitting element produces the light from its entire light emitting surface.

6. A vehicular lamp as claimed in claim 1, wherein the fixing member is formed of a material with a thermal conductivity greater than air.

7. A vehicular lamp, comprising:
a fixing member;
a semiconductor light emitting element that emits light, the semiconductor light emitting element mounted on the fixing member;
a sealing member formed of a material through which light passes, the sealing member arranged above the semiconductor element, said sealing member having a certain refractive index;
a lens that forms at least a part of a cut line of the vehicular lamp, wherein:
the semiconductor light emitting element is fixed on the fixing member by aligning an apparent position of a first side of said semiconductor light emitting element, when viewed through the sealing member, to a reference position;
the reference position is an optical center of the vehicular lamp;
the cut line defines a boundary between bright and dark portions of a light distribution pattern of said vehicular lamp; and
the cut line corresponds to a projection of a shape of the first side of the semiconductor light emitting element.

8. A vehicular lamp as claimed in claim 7, wherein said sealing member is shaped like a convex lens.

9. A vehicular lamp as claimed in claim 7, wherein the semiconductor light emitting element comprises a light emitting surface that is rectangular.

10. A vehicular lamp as claimed in claim 9, wherein the semiconductor light emitting element produces the light from its entire light emitting surface.

11. A vehicular lamp as claimed in claim 7, wherein the fixing member is formed of a material with a thermal conductivity greater than air.

* * * * *